(12) United States Patent
Yung et al.

(10) Patent No.: US 11,776,930 B2
(45) Date of Patent: Oct. 3, 2023

(54) DIE BOND HEAD APPARATUS WITH DIE HOLDER MOTION TABLE

(71) Applicant: ASMPT SINGAPORE PTE. LTD., Singapore (SG)

(72) Inventors: Chung Sheung Yung, Hong Kong (HK); Pak Kin Leung, Hong Kong (HK)

(73) Assignee: ASMPT SINGAPORE PTE. LTD., Singapore (SG)

( * ) Notice: Subject to any disclaimer, the term of this patent is extended or adjusted under 35 U.S.C. 154(b) by 826 days.

(21) Appl. No.: 16/715,383

(22) Filed: Dec. 16, 2019

(65) Prior Publication Data
US 2021/0183809 A1    Jun. 17, 2021

(51) Int. Cl.
*H01L 23/00* (2006.01)
*H01L 21/66* (2006.01)

(52) U.S. Cl.
CPC ............. *H01L 24/75* (2013.01); *H01L 22/12* (2013.01); *H01L 2224/75702* (2013.01); *H01L 2224/75824* (2013.01)

(58) Field of Classification Search
CPC ............ H01L 24/75; H01L 22/12; H01L 2224/75702; H01L 2224/75824; H01L 2224/75303; H01L 2224/75753; H01L 2224/75821; H01L 2224/75841; H01L 2224/81132; H01L 2224/83132; H01L 23/544; H01L 2223/54426; H01L 2223/54473; H01L 2223/54486; H01L 2224/75842; H01L 2224/8113; H01L 2224/8313; H01L 21/67092; H01L 21/68; H01L 24/741; H01L 24/81; H01L 24/71; H01L 24/89
See application file for complete search history.

(56) References Cited

U.S. PATENT DOCUMENTS

| | | | |
|---|---|---|---|
| 9,142,532 B2 | 9/2015 | Suga | |
| 2013/0122610 A1* | 5/2013 | Chung | H01L 21/6838 156/379 |
| 2015/0048523 A1* | 2/2015 | Suga | H01L 24/13 228/104 |

FOREIGN PATENT DOCUMENTS

| | | | |
|---|---|---|---|
| JP | H05109789 A | * 4/1993 | |
| TW | 201320254 A | 5/2013 | |
| WO | WO 2013/161891 A1 | 10/2013 | |
| WO | WO 2015/146442 A1 | 10/2015 | |
| WO | WO-2015146442 A1 | * 10/2015 | H01L 24/75 |

OTHER PUBLICATIONS

Taiwan Office Action, dated Apr. 15, 2022, issued in corresponding Taiwanese Patent Application No. 109140400. English translation.

* cited by examiner

Primary Examiner — Ermias T Woldegeorgis
(74) Attorney, Agent, or Firm — OSTROLENK FABER LLP

(57) ABSTRACT

A die bond head apparatus has a die bond head body coupled to a die bond head motion table, a die holder motion table mounted on the die bond head body and a die holder which is operative in use to secure a semiconductor die to a substrate. The die holder is positionable by the die holder motion table independently of the die bond head motion table.

16 Claims, 5 Drawing Sheets

DIE BOND HEAD APPARATUS WITH DIE HOLDER MOTION TABLE

FIELD OF THE INVENTION

The invention relates to a die bond head apparatus and method for bonding a semiconductor die onto a surface with high accuracy.

BACKGROUND

In high precision semiconductor packaging equipment, vision systems are often used to determine critical positions such as the location of a die relative to a substrate during bonding. The offset between the position of the die and the substrate is compensated by the movement of a bond head, which is supporting the die holding tool, to ensure the placement accuracy of the die on the substrate.

However, the accuracy of die placement on the substrate and the speed of die placement can be limited in existing apparatus. This is because the compensation of die position is typically performed by the motion table controlling the die holding bond head. In general, a tip of the die holding tool of the bond head is not positioned at the control point of the die bond head motion table. Thus, even after compensation, the die position recognized by the vision system may fail to achieve sub-micron accuracy.

It would be beneficial to provide for more accurate and speedy die placement as compared to the prior art.

SUMMARY OF THE INVENTION

It is thus an object of this invention to seek to provide an apparatus which overcomes at least some of the aforementioned problems of the prior art.

According to a first aspect of the invention, there is provided a die bond head apparatus, comprising: a die bond head body coupled to a die bond head motion table; a die holder motion table mounted on the die bond head body; and a die holder which is operative in use to secure a semiconductor die to a substrate, the die holder being positionable by the die holder motion table independently of the die bond head motion table. The first aspect recognizes that a problem with existing die bond head apparatus is that high placement accuracy of the die on the substrate is difficult to achieve. This can be due to the fact that the distance between the die holder being carried by the die bond head body and the motion table driving the die bond head body can be comparatively large, meaning that movement of the motion table can lead to unexpected positioning of the die holder. In particular, submicron positioning accuracies of the die holder may be unachievable when driven by the motion table. Also, the control systems driving the motion table can cause unstable operation where the positioning of the die holder varies from the intended location.

Accordingly, an apparatus is provided. The apparatus may be a die bond head apparatus. The apparatus may comprise a die bond head body. The die bond head body may be coupled to, mounted on, or carried by a die bond head motion table. The apparatus may comprise a die holder motion table. The die holder motion table may be coupled to, mounted on, or carried by the die bond head body. The apparatus may comprise a die holder. The die holder may be coupled to, mounted on, or carried by the die holder motion table. The die holder may be used to secure, place or position a semiconductor die on a substrate. The die holder may be positioned or located by the die holder motion table. In this way, a dual motion table arrangement is provided in which one motion table moves the die bond head body (including the die holder) and a second motion table moves the die holder. This enables the die bond head body to be positioned proximate a die placement position on the substrate and the die holder motion table can precisely position the die holder at the placement position. This reduces the distance between the die holder itself and the die holder motion table, meaning that movement of the die holder motion table can lead to more accurate positioning of the die holder. In particular, submicron positioning accuracy is achievable by the die holder when it is driven by the die holder motion table. Also, the control systems driving the die holder motion table may position the die holder at the intended location more quickly and accurately.

In one embodiment, the die bond head motion table is coupled to a first end of the die bond head body and the die holder motion table is mounted at a second end of the die bond head body distal from the first end. Accordingly, the die bond head motion table may be positioned towards one end of the die bond head body, while the die holder motion table may be positioned towards the other end of the die bond head body. This means that inaccurate positioning of the die bond head by the die bond head motion table may be corrected by the die holder motion table, which is positioned closer to the die holder.

In one embodiment, the die holder motion table is operative in use to displace the die holder with respect to at least one of the die bond head body and the die bond head motion table. Hence, the die holder motion table may change the position of the die holder with respect to the die bond head body and/or the die bond head motion table.

In one embodiment, the die holder motion table is operative in use to displace the die holder along more than one axis on a plane. Accordingly, the die holder motion table may displace or move the die holder along one or both axes of the plane.

In one embodiment, the die holder motion table is operative in use to displace the die holder along at least one axis common with the die bond head motion table. The die bond head motion table may displace the die bond head body along more than one axis on a plane, as well as along an axis transverse to that plane. The die holder motion table may displace the die holder along one or more of the same axes as the die bond head motion table.

In one embodiment, the die holder motion table is operative in use to displace the die holder with greater precision than the die bond head motion table is operative in use to displace the die bond head body. Accordingly, the die holder motion table may more accurately position the die holder than the die bond head motion table positions the die bond head body.

In one embodiment, the die holder motion table has a displacement range which is smaller than the die bond head motion table. Accordingly, the die holder motion table may have a smaller range of movement positions than the die bond head motion table.

In one embodiment, the die holder motion table has a table support structure retained by the die bond head body and a moveable structure displaceable with respect to the table support structure. Accordingly, the die bond head motion table may have a table support or fixed structure which attaches to the die bond head body and a movable or displaceable structure which is movable with respect to the table support structure.

In one embodiment, the die holder motion table comprises at least one actuator operative in use to displace the moveable structure with respect to the table support structure. Accordingly, one or more actuators may be provided which, when operated, move or relocate the movable structure with respect to the table support structure.

In one embodiment, the at least one actuator is operative in use to displace the moveable structure along more than one axis. Accordingly, the actuators may be used to move the movable structure along one or more axes on the plane.

In one embodiment, the at least one actuator is operative in use to rotate the moveable structure about at least one axis. Accordingly, the actuators may be used to rotate or pivot the movable structure about an axis extending transversely to the plane.

In one embodiment, the die holder motion table comprises at least one of a bearing and a flexure coupling the moveable structure with the table support structure and is operative in use to facilitate movement of the moveable structure with respect to the table support structure. Accordingly, a bearing and/or a flexure coupling may be provided to assist or enable movement of the movable structure with respect to the table support structure.

In one embodiment, the die holder motion table comprises a location identifier operative to provide an indication of the location of the moveable structure. Accordingly, an identifier may be provided which may provide information to assist in identifying the location or position of the movable structure.

In one embodiment, the die holder is carried by the moveable structure. Accordingly, the die holder may be mounted on or carried by the movable structure.

In one embodiment, the die holder is positioned on the moveable structure to face towards the substrate. Accordingly, the die holder may be located so that, once brought towards the substrate, it abuts the die held by the die holder against the substrate.

In one embodiment, the location identifier comprises a linear encoder having respective components separately mounted on the moveable structure and the table support structure. Accordingly, one or more linear encoders may be provided to provide position information of the movable structure with respect to the table support structure.

In one embodiment, the moveable structure comprises at least one inspection light path passing through the moveable structure that is positioned for imaging of at least a portion of the semiconductor die held by the die holder. Accordingly, the location of the semiconductor die may be determined by imaging through an inspection light path provided in the movable structure.

In one embodiment, the inspection light path comprises a void in the movable structure.

In one embodiment, the apparatus comprises at least one imaging device operative in use to image at least a portion of the semiconductor die held by the die holder to provide at least one of position and orientation information of the semiconductor die. Accordingly, the imaging device may image the semiconductor die to provide position and/or orientation information relating to the semiconductor die.

In one embodiment, the apparatus comprises a controller operative in use to locate the die holder proximate a bonding location by manipulating the bond head body position using the die bond head motion table and to correct at least one of a position and orientation of the semiconductor die held by the die holder in response to at least one of the position and orientation information by manipulating the die holder position using the die holder motion table. Accordingly, the die bond head motion table may be operated to locate the bond head body close to a bonding location and the die holder motion table may position the die holder more precisely at the bonding location.

According to a second aspect of the invention, there is provided a method, comprising: locating the die holder of the die bond head apparatus of the first aspect proximate a bonding location by manipulating the bond head body position using the die bond head motion table; correcting at least one of a position and orientation of the semiconductor die held by the die holder by manipulating the die head position using the die holder motion table; and bonding the semiconductor die at the bonding location.

These and other features, aspects, and advantages will become better understood with regard to the description section, appended claims, and accompanying drawings.

BRIEF DESCRIPTION OF THE DRAWINGS

Embodiments of the present invention will now be described, by way of example only, with reference to the accompanying drawings, in which.

In the drawings, like parts are denoted by like reference numerals.

DETAILED DESCRIPTION

Before discussing embodiments in any more detail, first an overview will be provided. Embodiments provide an apparatus having a body which is mounted on a motion table and a further motion table is mounted on the body which carries a holder. The two motion tables are operable independently of each other to locate the holder at a desired position. Generally, position control of the motion table carrying the holder is more accurate than the position control of the motion table carrying the body. This two motion table approach helps to position the holder more accurately and quickly than is otherwise possible using a single motion table. For example, one embodiment includes at least one motion table system. The motion table system includes: a mini motion table which enables movement in the directions along the X and Y axes and rotational directions (typically about the Z axis); an encoder scale for the mini motion table in the XY directions and an encoder read head for the mini motion table. The mini motion table is mounted on a bondhead module and includes an XY actuator, for example, voice coil motors, an air bearing and an XY scale. The read head is mounted on a different module, for example, an optical system. The position of the mini motion table controlled with the reference read head on the optical system hence the mini motion table has its position controlled relative to the optical system. The mini motion table position viewed and determined by the optical system via an optical path is hence maintained in real time even if the mini motion table and the vision system are subject to different lateral vibrations. The mini motion table position is thus always positioned where the vision system is looking at. Such an approach can improve the accuracy of the position and orientation of the die during the correction of the relative offset between the die and the bonding location prior to depositing the die onto the bonding location.

Die Bond Head Apparatus

Figure 1:
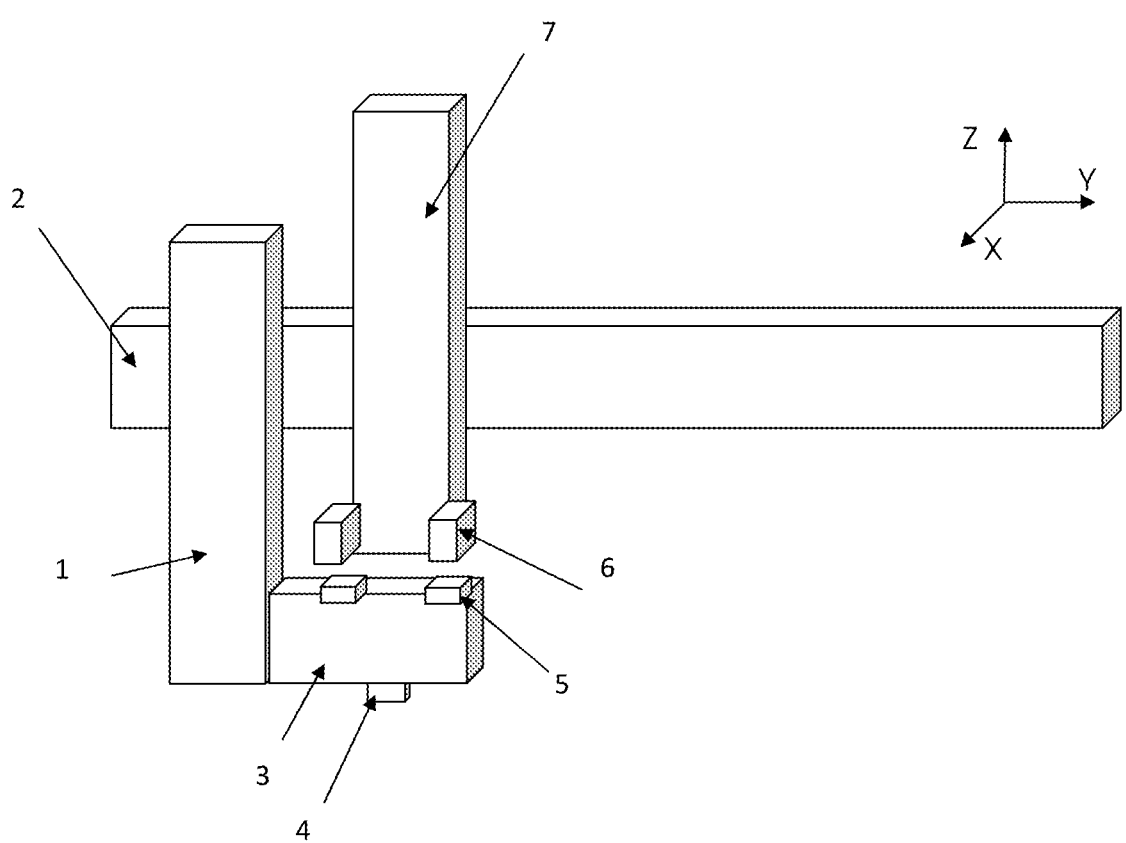
FIG. 1 illustrates schematically a die bond head apparatus according to a first embodiment of the invention.

FIG. 1 illustrates schematically a die bond head apparatus according to a first embodiment of the invention. A die bond head motion table 2 is provided, to which a die bond head body 1 is attached towards one end. The die bond head motion table 2 is typically constructed to displace the die bond head body 1 along X, Y and Z axes. A die holder motion table 3 is provided, which is also attached to the die bond head body 1 towards another end of the die bond head body 1. The die holder motion table 3 enables movement along the X and Y axes and a rotary motion about the Z axis. The die holder motion table 3 carries a die holder 4 and location encoder scales 5. The die holder motion table 3 is effectively mounted on the die bond head motion table 2 via the die bond head body 1. An optical system 7 is carried on a motion table. The optical system 7 carries an encoder read head 6 which reads the encoder scales 5.

In operation, the optical system 7 is typically positioned using an optical system motion table at a placing location where a die (not shown) is to be placed onto a substrate (not shown). The optical system 7 images the placing location on the substrate. The die bond head motion table 2 moves the die bond head body 1 to a pickup location and picks up a die using the die holder 4. After picking the die, which is held by the die holder 4, the die bond head motion table 2 positions the bond head body 1 (and with it the die holder motion table 3 and the die holder 4 holding the die) in the vicinity of the optical system 7 at the placing location. The optical system 7 and, in particular, the encoder read head 6 detects the current readings of the encoder scales 5 when the die holder 4 holding the die is close to the placing location. The die bond head motion table 2 then ceases moving the die bond head body 1 and instead the die holder motion table 3 is activated to position the die holder motion table 3 and the die holder 4 holding the die to the placing location. The control of the die holder motion table 3 is achieved through feedback provided by the encoder read head 6 when reading the encoder scales 5. Once in the correct position, then the die holder 4 can place the die onto the substrate at the correct placing location.

By having a die bond head motion table 2 (which moves the position of the die bond head body 1) and a separate, independently controlled die holder motion table 3 (which adjusts the position of the die holder 4), more accurate positioning of the die can be achieved. In particular, it has been found that without the die holder motion table 3, sub-micron placement accuracy of the die is difficult to achieve. This is because, when trying to achieve high position accuracy, movement of the die bond head motion table 2 can cause the position of the die bond head body 1 (and with it the die holder 4) to vary from an intended position, which is detected by the optical system 7. This can then cause the die bond head motion table 2 to be activated again to move the die bond head body 1 (and with it the die holder 4) further to correct the variance, which may still cause the position of the die holder 4 to vary from the intended position. This problem can be compounded by flexing of the die bond head body 1 or thermal effects causing movement of the die bond head body 1. However, by providing separate motion tables, the positioning of the die holder 4 at the placing location can be achieved much more accurately and quickly. In particular, the size and motion displacement of the die holder motion table 3 may be significantly less than that of the die bond head motion table 2, which means that the position of the die holder motion table 3 can be more accurately controlled and is less susceptible to the mechanical and thermal effects suffered by the die bond head body 1.

Collet Fiducial Marks

Figure 2:
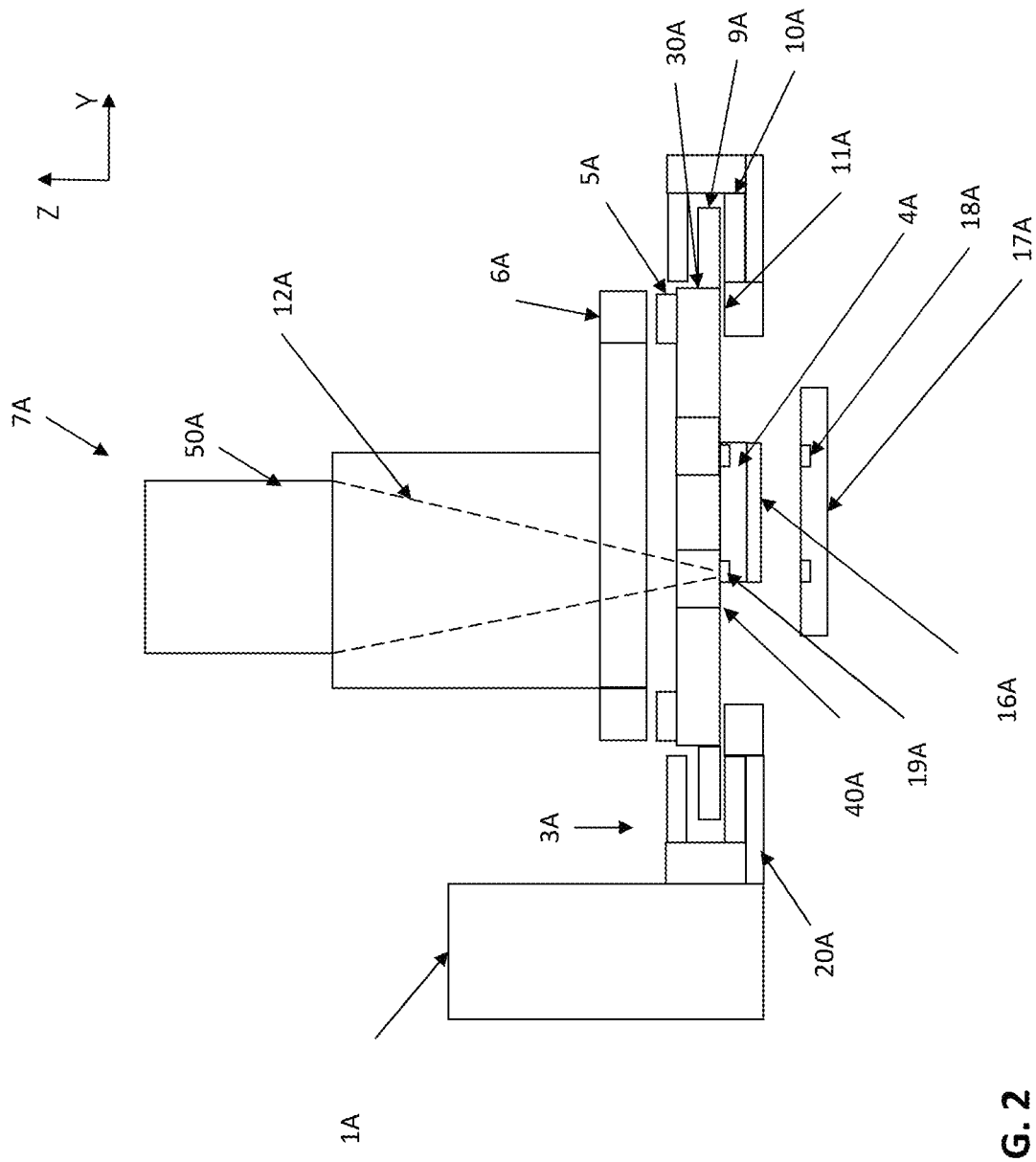
FIG. 2 is a side view of a die bond head apparatus according to the first embodiment.

FIG. 2 is a side view of a die bond head apparatus, according to the first embodiment of the invention. The arrangement is similar to that shown in FIG. 1 and this view focuses on the arrangement of the optical system 7A and the die holder motion table 3A. As can be seen, the die holder motion table 3A is connected to the die bond head body 1A. The die holder motion table 3A has a table support structure 20A which is fixed to the die bond head body 1A and a movable planar table 30A, which is movable with respect to the table support structure 20A. A number of air bearings 11A are provided to facilitate movement of the movable planar table 30A with respect to the table support structure 20A. A number of mini XY coils 9A are provided on the movable planar table 30A which interact with a corresponding number of mini XY magnets 10A provided on the table support structure 20A. Located on a surface facing towards the field of view of the optical system 7A are a number of encoder scales 5A.

A die holder (collet) 4A is positioned on a major face of the movable planar table 30A, facing a substrate 17A onto which a die 16A is to be placed. The die holder 4A is operable to pick up and retain in position the die 16A. The die holder 4A has a number of collet fiducial marks 19A which are visible to the optical system through apertures 40A in the movable planar table 30A. The optical system 7A has a camera 50A which images the collet fiducial marks 19A. Read heads 6A are mounted on the optical system 7A.

In operation, the optical system 7A is positioned by its motion table to image substrate fiducial marks 18A on the substrate 17A at the location that a die is to be placed. In other words, the target bond position of substrate 17A is determined by the substrate fiducial marks 18A using the optical system 7A before the die bond head body 1A is moved there for adjustment and placement.

The die bond head body 1A is positioned to pick up a die at a pickup location. The die bond head motion table 2A then moves the die bond head body 1A close to the placing location. This brings the movable planar table 30A into the field of view 12A of the optical system 7A. Once the movement of the die bond head body 1A under the control of the die bond head motion table 2A has ceased, then the optical system 7A determines the position of the die 16A by imaging the collet fiducial marks 19A. The mini XY coils 9A are energized as appropriate to displace the movable planar table 30A to the correct position relying on feedback from the encoder read heads 6A and imaging of the collet fiducial marks 19A. Once the die 16A has been correctly positioned and/or orientated at the placing location, the die 16A is then placed on the substrate 17A by displacing the die bond head body 1A in the Z direction towards the substrate 17A.

In other words, the die holder motion table 3A is controlled based on information provided by the read head 6A. Hence, the die 16A and die holder 4A on the die holder motion table 3A have their positions controlled relative to the optical system 7A. The position of the die 16A is recognized by the optical system 7A via an optical path 12A and a motion table hollow feature in the form of apertures 14A to image the collet fiducial marks 19A. The position may be maintained real-time to a sub-micron level accuracy even if the bond head motion table 2A and the frame optical system 7A are undergoing independent lateral variations in relative positions. In a worst case, the frame optical system 7A can sit on a second motion table such that the position of the die holder motion table 3A is controlled with a different reference frame. The die bond head motion table 2A and the optical system can thus be positioned in two different reference frames, without a known position relation. To remove this uncertainty, the position of the die bond head motion table 2A can further be controlled with reference to the read head 6A mounted on the frame optical system 7A or the optical system motion table if the optical system motion table can be moved. After the die holder motion table 3A moves in the XY direction to compensate for the error recognized by the vision system, the position of the die 16A will move within a target region recognized once again by the frame optical system 7A. The die holder motion table 3A then drives down the die 16A and is capable of achieving a sub-micron level of bonding accuracy.

Die Fiducial Marks

Figure 3:
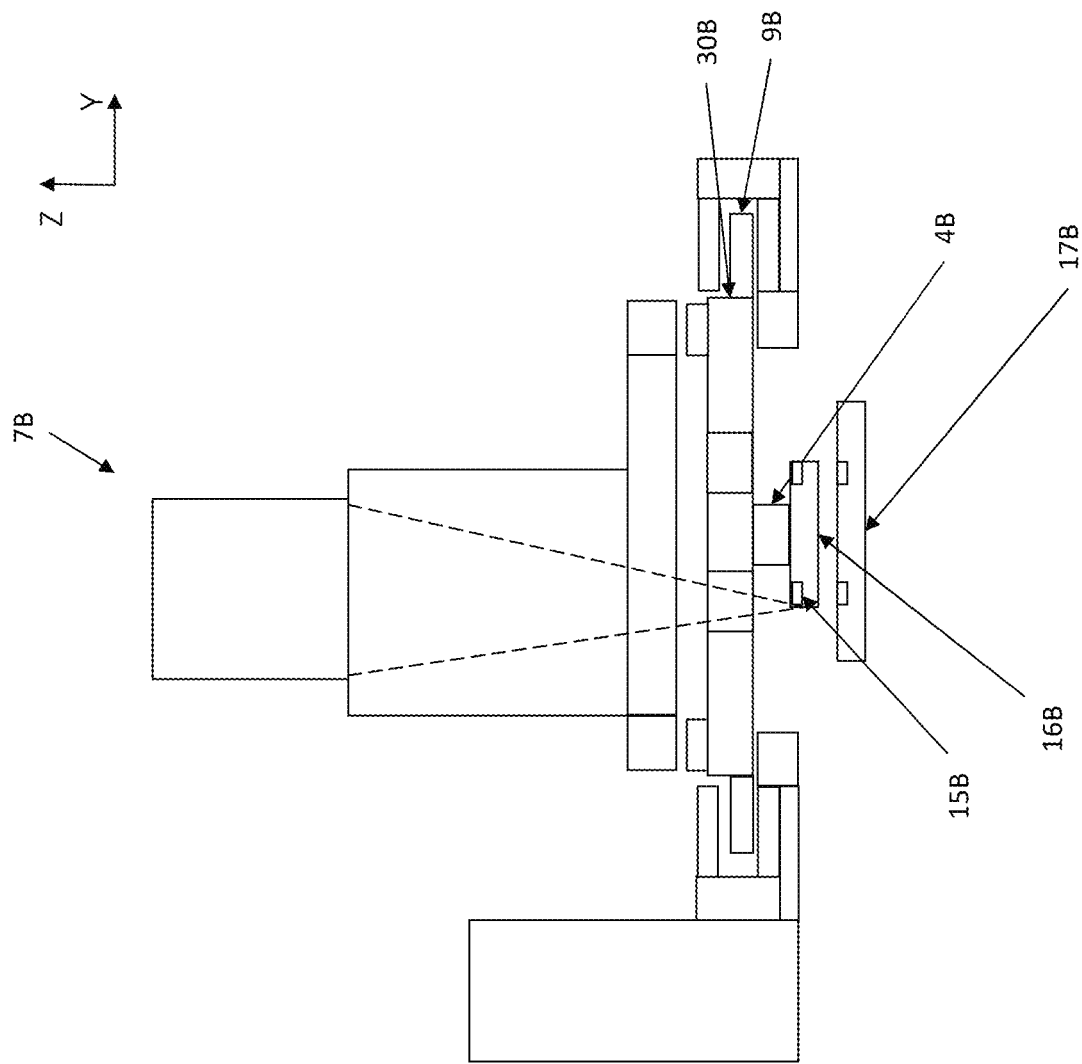
FIG. 3 is a side view of a die bond head apparatus according to a second embodiment of the invention.

FIG. 3 illustrates a second embodiment of the invention. This embodiment is identical to that shown in FIG. 2 with the exception that the die holder 4B is smaller than the die holder 4A mentioned above, which enables die fiducial marks 15B to be imaged directly by the optical system 7B. This enables any rotational offset of the die 16B about the Z axis to be also accommodated by rotating the movable planar table 30B about the Z axis by energizing the mini XY coils 9B in order to align the die 16B with the substrate 17B.

Figure 4:
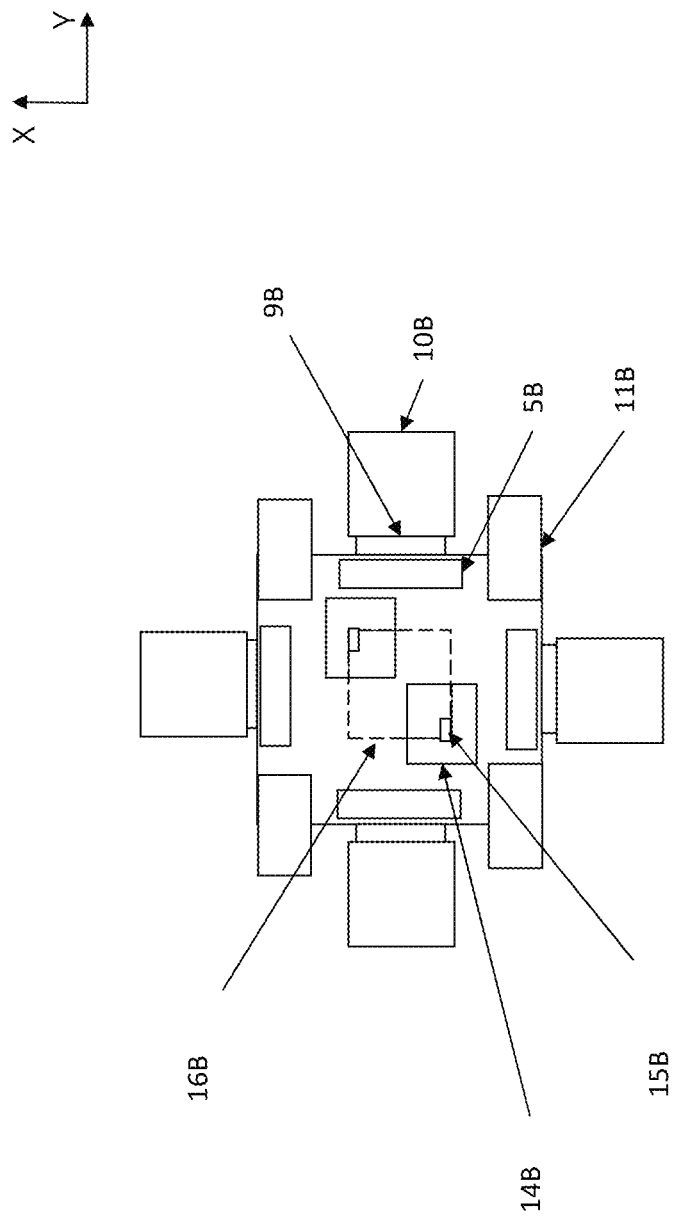
FIG. 4 is a plan view of a movable planar table and the table support structure according to the first embodiment.

FIG. 4 is a plan view of the movable planar table 30B, as observed by the optical system 7B, which is configured to image the die fiducial marks 15B of the die 16B through the motion table hollow feature in the form of apertures 14B. As can be seen, the mini XY magnets 10B and the mini XY coils 9B are located on each side of the movable planar table 30B to facilitate their motion (assisted by the air bearings 11B) along the X and Y axes, as well as enabling the movable planar table 30B to be rotated about the Z axis. Feedback on the current location of the movable planar table 30B is provided by the encoder scales 5B.

Figure 5:
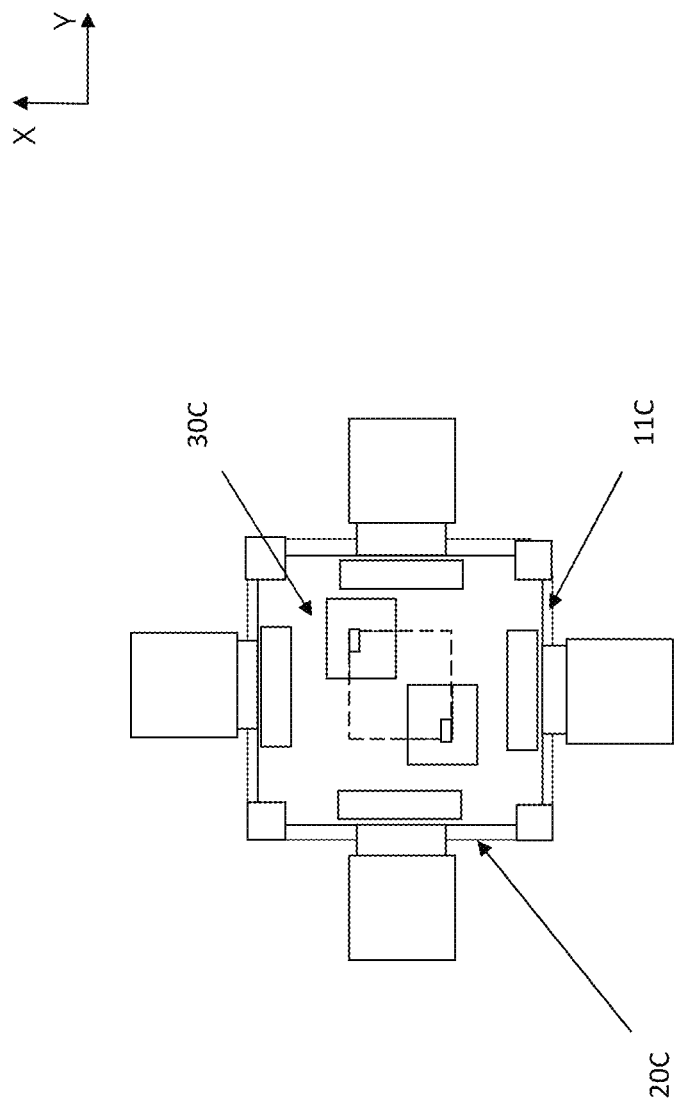
FIG. 5 is a top down view of the movable planar table and the table support structure according to the first embodiment.

FIG. 5 illustrates an alternative arrangement for the movable planar table and the table support structure. In this arrangement, rather than having air bearings, instead one or more flexures 110 are provided, which supports the movable planar table 30C within the table support structure 20C, while enabling the movable planar table 30C to move with respect to the table support structure 20C.

Although the present invention has been described in considerable detail with reference to certain embodiments, other embodiments are possible. In particular, movable planar table may be actuated by voice coil motors or piezo-electric actuators.

Therefore, the spirit and scope of the appended claims should not be limited to the description of the embodiments contained herein.

The invention claimed is:

1. A die bond head apparatus, comprising:
 a die bond head body coupled to a die bond head motion table for moving the die bond head body along at least one axis;
 a die holder motion table mounted on the die bond head body;
 a die holder which is operative in use to secure a semiconductor die to a substrate, the die holder being positionable by the die holder motion table to move the die holder along the at least one axis independently of the die bond head motion table; and
 an imaging device positioned over the substrate that is operative in use to image a placing location on the substrate, the imaging device being configured such that the die holder motion table is movable to a position between the imaging device and the substrate such that the die holder motion table is located between the imaging device and the die holder, whereat the imaging device is further operative to image at least a portion of the die holder and/or the semiconductor die held by the die holder to determine at least one of position and orientation information of the die holder and/or the semiconductor die after the die bond head body is located proximate the placing location along the at least one axis by the die bond head motion table, wherein the die holder motion table is further operative to adjust the position and orientation of the die holder and/or the semiconductor die relative to the placing location,
 wherein the die holder motion table comprises at least one aperture through which at least one inspection light path passes through the die holder motion table for allowing the imaging device to image at least a portion of the die holder and/or the semiconductor die held by the die holder.

2. The apparatus of claim 1, wherein the die holder motion table has a table support structure retained by the die bond head body and a moveable structure displaceable with respect to the table support structure.

3. The apparatus of claim 2, wherein the moveable structure comprises the at least one inspection light path that passes through the moveable structure that is positioned for imaging of at least a portion of the die holder and/or the semiconductor die held by the die holder.

4. The apparatus of claim 3, wherein the inspection light path comprises a void in the movable structure.

5. The apparatus of claim 2, wherein the die holder motion table comprises at least one of a bearing and a flexure coupling the moveable structure with the table support structure and operative in use to facilitate movement of the moveable structure with respect to the table support structure.

6. The apparatus of claim 2, wherein the die holder motion table comprises at least one actuator operative in use to displace the moveable structure with respect to the table support structure.

7. The apparatus of claim 6, wherein the at least one actuator is operative in use to displace the moveable structure along more than one axis.

8. The apparatus of claim 1, wherein the die holder motion table comprises a location identifier operative to provide an indication of the location of the moveable structure.

9. The apparatus of claim 8, wherein the location identifier comprises a linear encoder having respective components separately mounted on the moveable structure and the table support structure.

10. The apparatus of claim 1, wherein the die bond head motion table is coupled to a first end of the die bond head body and the die holder motion table is mounted at a second end of the die bond head body distal from the first end.

11. The apparatus of claim 1, wherein the die holder motion table is operative in use to displace the die holder with respect to at least one of the die bond head body and the die bond head motion table.

12. The apparatus of claim 1, wherein the die holder motion table is operative in use to displace the die holder along more than one axis on a plane.

13. The apparatus of claim 1, wherein the die holder motion table is operative in use to displace the die holder with greater precision than the die bond head motion table is operative in use to displace the die bond head body.

14. The apparatus of claim 1, wherein the die holder motion table has a displacement range which is smaller than the die bond head motion table.

15. The apparatus of claim 1, comprising a controller operative in use to locate the die holder proximate a bonding location by manipulating the die bond head body position using the die bond head motion table and to correct at least one of a position and orientation of the semiconductor die held by the die holder in response to at least one of the position and orientation information by manipulating the die holder position using the die holder motion table.

16. A method, comprising:
  imaging a placing location on a substrate with an imaging device of the die bond head apparatus of claim 1,
  locating the die holder of the die bond head apparatus proximate the placing location by manipulating the die bond head body position using the die bond head motion table such that the die holder motion table is moved to a position between the imaging device and the substrate;
  imaging, with the imaging device, at least a portion of the die holder and/or the semiconductor die held by the die holder through at least one aperture through which at least one inspection light path passes through the die holder motion table to determine at least one of position and orientation information of the die holder and/or the semiconductor die;
  adjusting at least one of a position and orientation of the semiconductor die held by the die holder relative to the placing location using the die holder motion table; and thereafter
  bonding the semiconductor die at the placing location.

\* \* \* \* \*